(12) United States Patent
Classen et al.

(10) Patent No.: US 9,434,606 B2
(45) Date of Patent: Sep. 6, 2016

(54) MICROMECHANICAL INERTIAL SENSOR AND METHOD FOR MANUFACTURING SAME

(71) Applicant: Robert Bosch GmbH, Stuttgart (DE)

(72) Inventors: Johannes Classen, Reutlingen (DE); Mirko Hattass, Stuttgart (DE); Daniel Christoph Meisel, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 208 days.

(21) Appl. No.: 13/890,752

(22) Filed: May 9, 2013

(65) Prior Publication Data

US 2013/0299925 A1    Nov. 14, 2013

(30) Foreign Application Priority Data

May 14, 2012   (DE) .................. 10 2012 208 030

(51) Int. Cl.
| | |
|---|---|
| *B81C 1/00* | (2006.01) |
| *B81B 3/00* | (2006.01) |
| *G01P 15/00* | (2006.01) |
| *G01P 15/08* | (2006.01) |

(52) U.S. Cl.
CPC ......... *B81C 1/00134* (2013.01); *B81B 3/0018* (2013.01); *B81C 1/00246* (2013.01); *G01P 15/0802* (2013.01); *B81B 2201/025* (2013.01); *B81C 1/00333* (2013.01)

(58) Field of Classification Search
None
See application file for complete search history.

(56) References Cited

U.S. PATENT DOCUMENTS

| | | | |
|---|---|---|---|
| 2008/0217784 A1* | 9/2008 | Binder | H01L 21/486 257/762 |
| 2010/0007016 A1* | 1/2010 | Oppermann | H01L 21/486 257/737 |
| 2010/0095739 A1* | 4/2010 | DeNatale | G01C 19/56 73/1.37 |
| 2010/0109102 A1* | 5/2010 | Chen | B81C 1/00238 257/417 |

OTHER PUBLICATIONS

Martienssen et al., Springer Handbook of Condensed Matter and Materials Data, Springer, 2005, p. 344, isbn3540304371.*

* cited by examiner

*Primary Examiner* — Steven Loke
*Assistant Examiner* — Juanita Rhodes
(74) *Attorney, Agent, or Firm* — Norton Rose Fulbright US LLP

(57) ABSTRACT

A micromechanical inertial sensor includes an ASIC element having a processed front side, an MEMS element having a micromechanical sensor structure, and a cap wafer mounted above the micromechanical sensor structure, which sensor structure includes a seismic mass and extends over the entire thickness of the MEMS substrate. The MEMS element is mounted on the processed front side of the ASIC element above a standoff structure and is electrically connected to the ASIC element via through-contacts in the MEMS substrate and in adjacent supports of the standoff structure. A blind hole is formed in the MEMS substrate in the area of the seismic mass, which blind hole is filled with the same electrically conductive material as the through-contacts, the conductive material having a greater density than the MEMS substrate.

5 Claims, 5 Drawing Sheets

MICROMECHANICAL INERTIAL SENSOR AND METHOD FOR MANUFACTURING SAME

BACKGROUND OF THE INVENTION

1. Field of the Invention

The present invention relates to a micromechanical inertial sensor, including at least one ASIC (application specific integrated circuit) element having a processed front side, an MEMS (microelectromechanical systems) element having a micromechanical sensor structure, which includes at least one seismic mass and extends over the entire thickness of the MEMS substrate, and including a cap wafer, which is mounted above the micromechanical sensor structure of the MEMS element. The MEMS element is mounted on the processed front side of the ASIC element above a standoff structure and electrically connected to the ASIC element via through-contacts in the MEMS substrate and in adjacent supports of the standoff structure. In addition, the present invention relates to a method for manufacturing such a micromechanical inertial sensor.

2. Description of the Related Art

Micromechanical inertial sensors are used to detect translatory and rotatory accelerations. They have been manufactured in mass production for many years for a wide range of applications, for example, in the fields of automotive engineering and consumer electronics, where miniaturization of the sensor components has become increasingly important. On the one hand, miniaturization makes a significant contribution toward lowering the manufacturing costs of the sensor components and thus also of the terminal equipment. On the other hand, an increasing number of functions—and therefore components —are to be included in each piece of terminal equipment, in particular in the field of consumer electronics, while the terminal equipment itself is becoming ever smaller. Consequently, ever less room is available on the application circuit boards for the individual components.

With micromechanical inertial sensors of the type in question here, the accelerations are detected with the aid of the micromechanical sensor structure of the MEMS element and evaluated with the aid of the ASIC element. The micromechanical sensor structure includes at least one elastically suspended seismic mass, which is deflected due to accelerations. These accelerations may also be induced by centrifugal forces or rotary movements. With the aid of suitable circuitry means, the deflections of the seismic mass are converted into electric signals, which are then sent to the evaluation circuit on the ASIC element. The larger the seismic mass, the greater is also its deflection and thus also the greater is the measuring sensitivity of the sensor.

A method for manufacturing a micromechanical inertial sensor of the type defined at the outset is described in US Patent Application Publication No. 2010/0109102 A1. The known method is directed to a processed ASIC substrate having the circuit functions of the inertial sensor component to be manufactured. An insulating layer is deposited on the processed front side of the ASIC substrate and structured. The supports of a standoff structure for the mounting of an MEMS substrate are created. The unstructured MEMS substrate is bonded to the standoff structure and then thinned down to a predefined structural height. Only then is the MEMS substrate structured. In a first structuring step, through-openings are created in the MEMS substrate, which also extend through the supports of the standoff structure down to the ASIC substrate. These through-openings are then filled with an electrically conductive material and thus form through-contacts to the ASIC substrate. Only then in a second structuring step is the micromechanical sensor structure having the seismic mass, which extends over the entire thickness of the MEMS substrate, exposed. A prestructured cap wafer is then mounted above the micromechanical sensor structure, so that it is hermetically enclosed between the ASIC substrate and the cap wafer. Only then are the components released from the wafer composite and separated.

The known method permits an inexpensive mass production of robust components having a micromechanical sensor function and a signal processing circuit since not only are the individual component parts manufactured here in the wafer composite—i.e., the ASIC element, the MEMS element and the cap—but also their assembly to form one component is implemented on the wafer level. The MEMS functions and the ASIC functions may be tested at the wafer level and even the calibration of the individual components may still be carried out on the wafer level before they are separated. Furthermore, the known components require a comparatively small mounting area due to the stacked design, which has positive effects on the manufacturing costs of the terminal equipment.

BRIEF SUMMARY OF THE INVENTION

In comparison with the manufacturing method described in US 2010/0109102 A1, measures for increasing the measuring sensitivity of a micromechanical inertial sensor are proposed with the present invention.

According to the present invention, at least one blind hole is formed in the MEMS substrate in the area of the seismic mass and then filled with the same electrically conductive material as the through-contacts, this electrically conductive material having a greater density than the MEMS substrate material.

The method described here provides for at least one blind hole to also be created in the MEMS substrate in the area of the seismic mass in a first structuring step in addition to through-openings for the through-contacts. In a subsequent process step, the through-openings together with the at least one blind hole are then filled with the electrically conductive material. Only thereafter in a second structuring step is the micromechanical sensor structure having the seismic mass in the MEMS substrate exposed.

Through the measures according to the present invention, the seismic mass may be increased without having to increase the geometric dimensions and in particular the chip area of the seismic mass. For this purpose, at least one part of the MEMS substrate material of the seismic mass is replaced by material of a higher density. According to the present invention, this exchange of material takes place together with the creation of the MEMS through-contacts, i.e., without any additional processing effort. Tungsten, copper, gold, platinum and iridium in particular are suitable for manufacturing the through-contacts and for filling the blind holes.

The manufacturing method according to the present invention may be varied in many ways, in particular with regard to the number, configuration and shape of the filled blind holes in the area of the seismic mass but also with regard to the connection of the ASIC substrate, the MEMS substrate and the cap wafer. The function, the determination and the site of assembly of the inertial sensor components to be manufactured must be taken into account here.

One essential aspect of the method according to the present invention is the structuring of the MEMS substrate after being mounted on the preprocessed ASIC substrate. The first structuring step, in which the through-openings for the MEMS through-contacts and the blind holes are created in the area of the seismic mass, and the second structuring step, in which the micromechanical sensor structure is defined and exposed, extend over the entire thickness of the MEMS substrate. The MEMS substrate is therefore advantageously initially thinned down to a structural height, which is suitable for implementation of the respective MEMS function prior to the structuring. The structuring of the MEMS substrate preferably takes place in a trench process since it is possible to create trench structures having a particularly high aspect ratio using this method.

In this context, it has proven to be advantageous to utilize the ARDE (aspect ratio dependent etching) effect of the trench process according to which the trench rate, i.e., how effectively the process gases are able to attack the material to be removed, depends on the diameter of the trench opening. Accordingly, the depth of the trench may be varied at a given duration of the etching attack based on the size of the trench opening. The larger the trench opening, the higher is the trench speed and the greater is also the depth of the trench at a given trench duration. Therefore, a larger cross section of the opening is selected for the through-openings of the through-contacts than for the at least one blind hole in the area of the seismic mass. Due to the size ratio between the trench openings, through-openings for the through-contacts may be created in a trench process and blind holes may be formed in the area of the seismic mass.

According to the present invention, the MEMS substrate is mounted on the processed front side of the ASIC substrate via a standoff structure to ensure the mobility of the seismic mass. This standoff structure may be implemented, for example, by a suitable structuring and electrical passivation of the mounting surface of the MEMS substrate, although that requires preprocessing of the MEMS substrate.

In a preferred variant of the method, the standoff structure is instead created on the surface of the ASIC substrate, namely following the preprocessing of the ASIC substrate, in which the circuit functions of the inertial sensor components to be manufactured are implemented. For this purpose, at least one insulating layer is deposited on the processed front side of the ASIC substrate and structured there to form the supports of the standoff structure. Openings for the through-contacts are advantageously also created there in selected supports. Alternatively, the first structuring step to create the through-openings in the MEMS substrate may also be continued until these through-openings also extend over the supports of the standoff structure as far as the processed surface of the ASIC substrate.

According to the present invention, the cap wafer is mounted above the micromechanical sensor structure of the MEMS element. For this purpose, the cap wafer may either be situated on the MEMS element or above the MEMS element on the ASIC element, so that the entire MEMS element is enclosed in a cavity between the cap wafer and the ASIC element.

The connections between the MEMS substrate and the ASIC substrate as well as between the cap wafer and the MEMS substrate or the ASIC substrate are preferably established using a bonding method since in this way a hermetically sealed mechanical connection as well as reliable electrical connections between the MEMS element and the ASIC element may be implemented. A series of known and practically tested process variants are available for this purpose, e.g., plasma-activated direct bonding or eutectic bonding. The sensor structure is reliably protected in this way against contamination, moisture and particles. Interfering environmental influences on the measuring signal are minimized. Furthermore, defined pressure conditions for the sensor structure, which significantly codetermine the damping behavior of the inertial sensor, may be created in this way within the cavity between the cap wafer and the ASIC substrate.

DETAILED DESCRIPTION OF THE INVENTION

The method according to the present invention for manufacturing a micromechanical inertial sensor having an ASIC element, an MEMS element and a cap wafer is directed to a preprocessed ASIC substrate. The ASIC substrate is advantageously equipped with a signal processing and evaluation circuit for the sensor function of the MEMS element within the scope of the preprocessing. In addition, however, MEMS-independent circuit functions may also be implemented.

Figure 1:
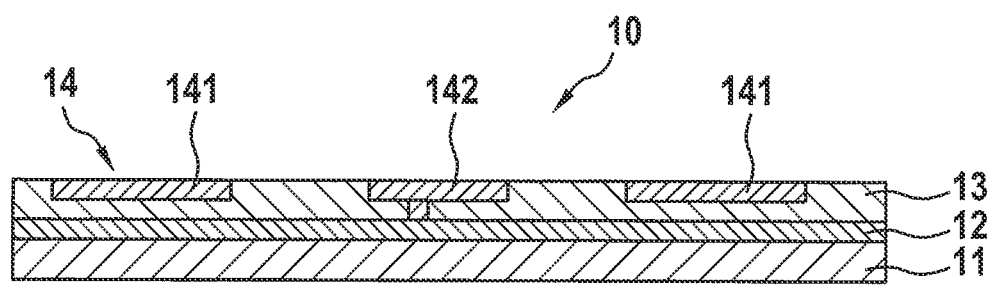
FIGS. 1 through 6 show, on the basis of schematic sectional views, the manufacture of a micromechanical inertial sensor according to the present invention until being capped.

FIG. 1 shows an ASIC substrate 10 after one such preprocessing. ASIC circuit functions 12 were initially integrated into a starting substrate 11. A layer structure was subsequently created on the substrate surface, including multiple insulating layers 13 and circuit levels 14 for interconnecting and contacting ASIC circuit functions 12. The preprocessing of ASIC substrate 10 will not be described in detail here since it is not specified in greater detail by the present invention. ASIC circuit functions 12 are therefore also shown only schematically, as is the layer structure, of which only the uppermost circuit level with terminal electrodes 141 and electrodes 142 for signal detection is shown.

Figure 2:
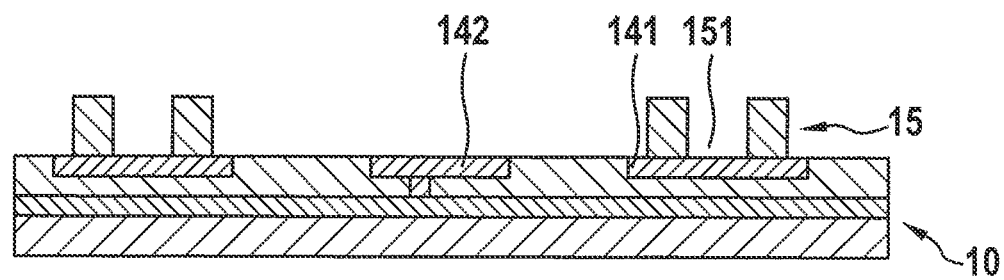

In the next method step, an oxide layer is deposited on the surface of ASIC substrate 10 and structured there to create a standoff structure having supports 15 for mounting a MEMS substrate. FIG. 2 shows the result of this structuring process and illustrates that accesses 151 to terminal electrodes 141 of the first circuit level of ASIC substrate 10 have been created during structuring of the oxide layer in the area of supports 15.

Figure 3:
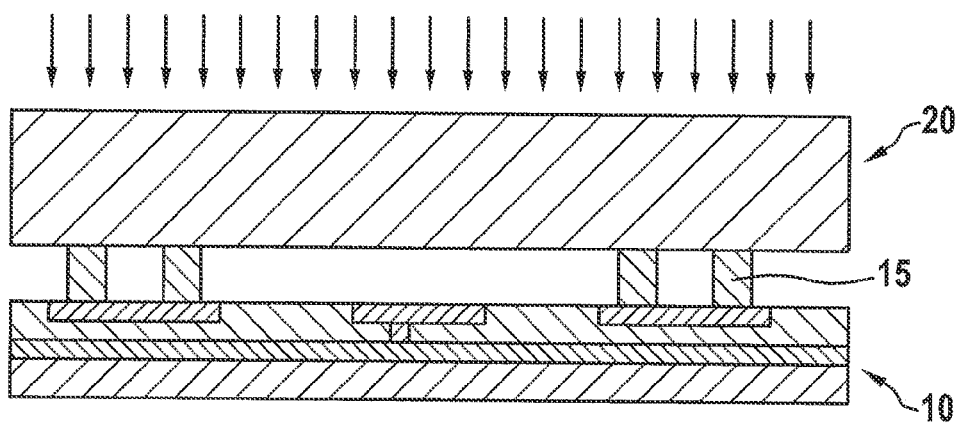

Supports 15 which have been structured out of the oxide layer form the mounting surface for an unstructured MEMS substrate 20. The connection between MEMS substrate 20 and ASIC substrate 10 is established here by bonding, for example, in a plasma-activated direct bonding method and is hermetically sealed. The relatively thick MEMS substrate 20 is now thinned down in a grinding process, for example, until its thickness corresponds approximately to the intended structural height of the micromechanical sensor structure. This is typically in a range between 10 µm and 150 µm. FIG. 3 shows ASIC substrate 10 with MEMS substrate 20, which has been thinned down but is still unstructured, and illustrates the function of supports 15 as spacers between the closed surface of ASIC substrate 10 and MEMS substrate 20.

MEMS substrate 20 is structured only in the composite with ASIC substrate 10. This structuring takes place in two steps.

Figure 4:
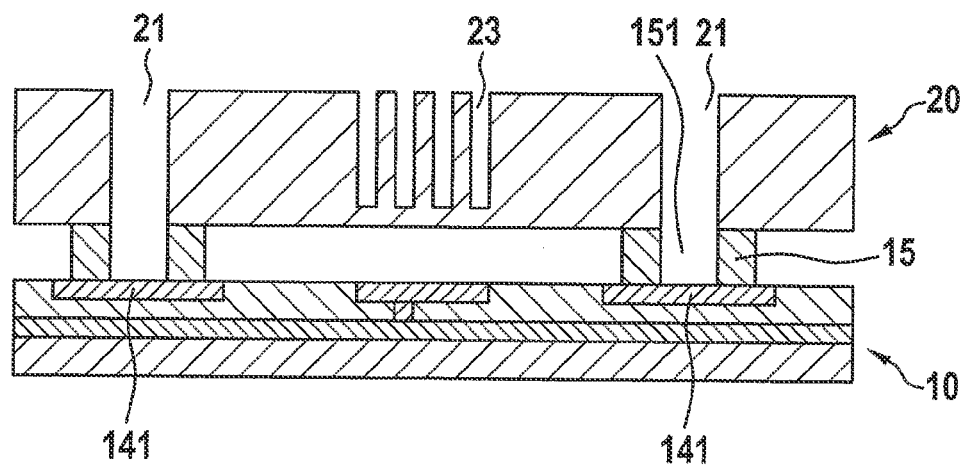

In the first structuring step, through-openings 21 are created for through-contacts 22, extending over the entire thickness of MEMS substrate 20. Through-openings 21 open into openings 151 in supports 15 of the standoff structure. Here they have an essentially circular cross section and an aspect ratio of 5:1 to 20:1. According to the present invention, blind holes 23 are also created in the first structuring step in the area of the seismic mass of the sensor structure, which is yet to be exposed. The structuring of through-openings 21 and blind holes 23 takes place here in a shared trench process for which the surface of MEMS substrate 20 is masked. With the aid of the trench mask, the position and the size of the trench openings for through-openings 21 and blind holes 23 are defined. FIG. 4 illustrates that the opening cross section of blind holes 23 has been selected here to be much smaller than the opening cross section of through-openings 21. Since the trench speed depends on the size of the trench openings, the trench depth also depends on the size of the trench openings at a predefined duration of the trench process. Therefore, in the area of the seismic mass, blind holes 23 have been formed whereas through-openings 21 have been created above supports 15 of the standoff structure. It should be pointed out here that the blind holes need not necessarily have a circular or square opening cross section but instead may also be shaped like slots as long as they are adequately narrow.

Figure 5:
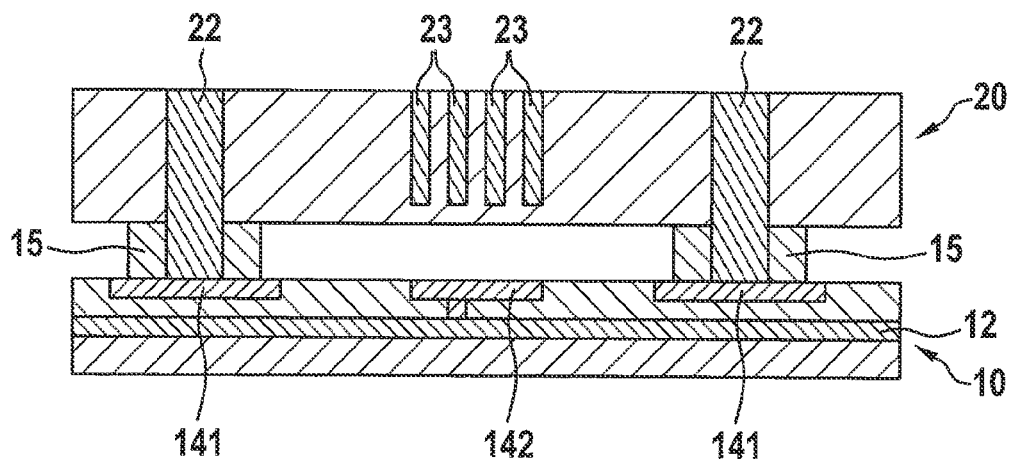

The walls of through-openings 21 and of blind holes 23 may then be coated with a conductive diffusion barrier, e.g., titanium nitride or titanium tungsten before being filled with an electrically conductive material, e.g., copper or tungsten in a deposition process. This forms through contacts 22 in the form of vias, which are a particularly protected and stable electrical connection between the MEMS element and the ASIC element. Furthermore, the seismic mass also increases since the electrically conductive material used here according to the present invention has a higher density than the MEMS substrate material. FIG. 5 shows ASIC substrate 10 including first MEMS substrate 20 after filling through-openings 21 and blind holes 23 and after conductive material deposited on the surface of MEMS substrate 20 has been removed.

Figure 6:
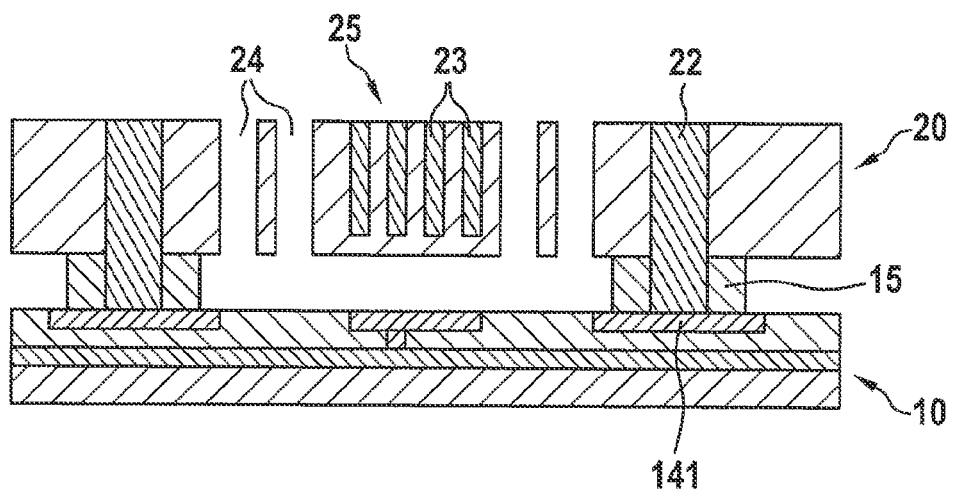

In the second structuring step, which is also preferably a trench process, the micromechanical sensor structure of MEMS element 20 is exposed. It includes a resiliently suspended seismic mass 25, the shape of which is defined by trenches 24. As shown in FIG. 6, the sensor structure extends over the entire thickness of MEMS substrate 20.

After structuring MEMS substrate 20, a prestructured cap wafer 31 or 32 is mounted above the sensor structure to enclose the sensor structure in cavity 26 between ASIC substrate 10 and cap wafer 31 or 32, so that it is hermetically sealed under defined pressure conditions.

Figure 7A:
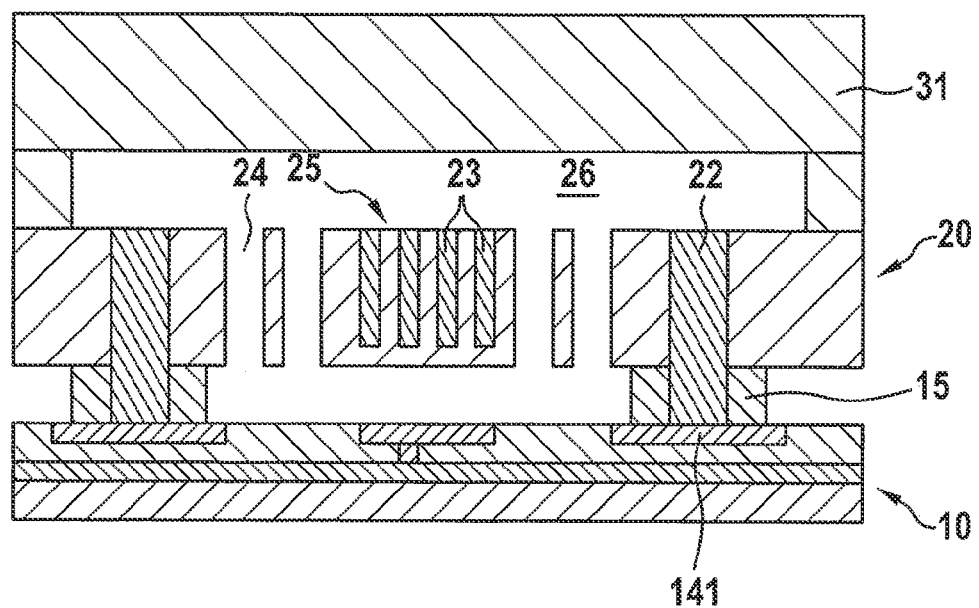
FIGS. 7a and 7b show a respective schematic sectional view of a capping variant for this inertial sensor.

In the case of FIG. 7a, cap wafer 31 was mounted on MEMS substrate 20, so that only the sensor structure is capped here.

Figure 7B:
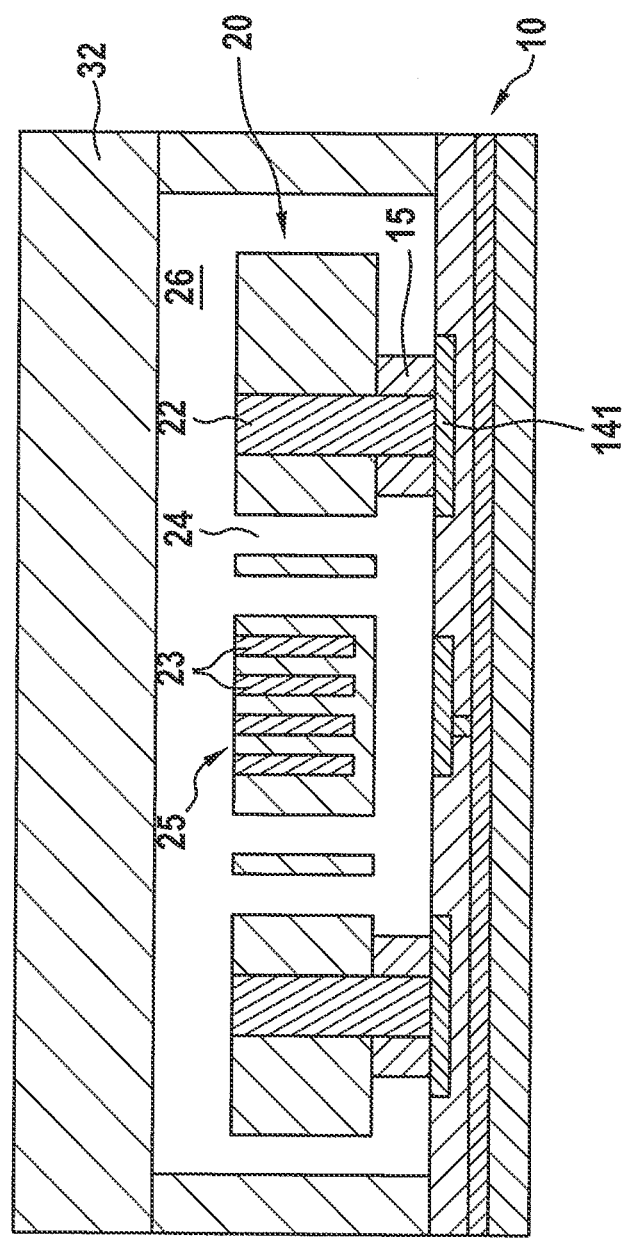

In contrast thereto, cap wafer 32 shown in FIG. 7b is situated above entire MEMS element 20 and mounted on ASIC substrate 10, so that entire MEMS element 20 is capped here. The connection between cap wafer 31 and MEMS substrate 20 as well as the connection between cap wafer 32 and ASIC substrate 10 have been established using a bonding method, for example, by eutectic bonding.

What is claimed is:

1. A micromechanical inertial sensor, comprising:
at least one ASIC element having a processed front side;
at least one MEMS element having a micromechanical sensor structure which includes at least one seismic mass and extends over an entire thickness of a substrate of the MEMS element, wherein the MEMS element is mounted on the processed front side of the ASIC element above a standoff structure, and wherein the MEMS element is electrically connected to the ASIC element via through-contacts in the substrate of the MEMS element and in adjacent supports of the standoff structure; and
a cap wafer mounted above the micromechanical sensor structure of the MEMS element;
wherein, at least in an area of the seismic mass, at least one blind hole is formed in the substrate of the MEMS element, the blind hole being filled with an electrically conductive material which also fills the through-contacts, and wherein the electrically conductive material has a greater density than the substrate material of the MEMS element.

2. The inertial sensor as recited in claim 1, wherein the through-contacts and the at least one blind hole are filled with one of tungsten, copper, gold, platinum or iridium.

3. The inertial sensor as recited in claim 2, wherein the standoff structure is formed (i) from at least one insulating layer and (ii) on the processed front side of the ASIC element.

4. The inertial sensor as recited in claim 2, wherein the cap wafer is mounted on the MEMS element or the ASIC element.

5. The inertial sensor as recited in claim 1, wherein the at least one blind hole being filled with the electrically conductive material does not conduct electricity through the entire thickness of the substrate of the MEMS element.

* * * * *